(12) United States Patent
Kim et al.

(10) Patent No.: US 8,890,135 B2
(45) Date of Patent: Nov. 18, 2014

(54) ORGANIC LIGHT EMITTING DISPLAY DEVICE WITH INSULATING LAYER FORMED AS MULTI-LAYERED STRUCTURE

(71) Applicant: Samsung Display Co., Ltd., Yongin (KR)

(72) Inventors: Gee-Bum Kim, Gyeonggi-do (KR); Jae-Ik Lim, Hwaseong-si (KR); Won-Sang Park, Asan-si (KR); Min-Woo Kim, Hwaseong-si (KR)

(73) Assignee: Samsung Display Co., Ltd., Yongin, Gyeonggi-Do ( * ) Notice: Subject to any disclaimer, the term of this patent is extended or adjusted under 35 U.S.C. 154(b) by 0 days.

(21) Appl. No.: 13/941,360

(22) Filed: Jul. 12, 2013

(65) Prior Publication Data

US 2014/0217370 A1 Aug. 7, 2014

(30) Foreign Application Priority Data

Feb. 4, 2013 (KR) .................. 10-2013-0012320

(51) Int. Cl.
*H01L 27/32* (2006.01)
*H01L 51/52* (2006.01)

(52) U.S. Cl.
CPC .................................. *H01L 51/5262* (2013.01)
USPC .................. 257/40; 257/89; 257/98; 257/99; 257/E27.119; 257/E51.022

(58) Field of Classification Search
CPC ............ H01L 27/3211; H01L 27/3244; H01L 27/3209; H01L 27/3232; H01L 29/7869; H01L 51/5262

USPC ............ 257/40, 89, 98–100, E27.119, 51.022
See application file for complete search history.

(56) References Cited

U.S. PATENT DOCUMENTS

| | | | |
|---|---|---|---|
| 2007/0254162 A1 | 11/2007 | Kozaki et al. | |
| 2007/0278493 A1* | 12/2007 | Sato | 257/72 |
| 2011/0041758 A1 | 2/2011 | An | |
| 2011/0042696 A1* | 2/2011 | Smith et al. | 257/89 |
| 2011/0198629 A1* | 8/2011 | Lee et al. | 257/89 |
| 2011/0204771 A1* | 8/2011 | Lee et al. | 313/504 |
| 2011/0248256 A1* | 10/2011 | Cok et al. | 257/40 |
| 2011/0298361 A1* | 12/2011 | Matsunaga et al. | 313/504 |
| 2012/0228603 A1* | 9/2012 | Nakamura | 257/40 |
| 2013/0021662 A1* | 1/2013 | Fike et al. | 359/291 |
| 2013/0027634 A1* | 1/2013 | Saneto et al. | 349/62 |
| 2013/0057137 A1* | 3/2013 | Zijp | 313/110 |
| 2013/0126936 A1* | 5/2013 | Yamazaki et al. | 257/99 |
| 2013/0187840 A1* | 7/2013 | Tomita et al. | 345/76 |
| 2013/0240856 A1* | 9/2013 | Ikeda et al. | 257/40 |

FOREIGN PATENT DOCUMENTS

| | | | |
|---|---|---|---|
| KR | 10-2006-0037729 A | 5/2006 | |
| KR | 10-2007-0102947 A | 10/2007 | |
| KR | 10-2011-0019966 A | 3/2011 | |
| KR | 10-2011-0101518 A | 9/2011 | |

* cited by examiner

*Primary Examiner* — Michael Lebentritt
(74) *Attorney, Agent, or Firm* — Knobbe Martens Olson & Bear LLP

(57) ABSTRACT

Provided is an organic light emitting display device, including a substrate, an insulating layer on the substrate, and a display element layer on the insulating layer, in which the insulating layer includes one or more low refractive layers and one or more high refractive layers.

20 Claims, 6 Drawing Sheets

ORGANIC LIGHT EMITTING DISPLAY DEVICE WITH INSULATING LAYER FORMED AS MULTI-LAYERED STRUCTURE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 C.F.R. §1.57.

This application claims priority to and the benefit of Korean Patent Application No. 10-2013-0012320, filed on Feb. 4, 2013, in the Korean Intellectual Property Office, the disclosure of which is incorporated herein by reference in its entirety.

BACKGROUND

1. Field

The present disclosure relates to an organic light emitting display device, and more particularly, to an organic light emitting display device with an insulating layer formed as a multi-layered structure.

2. Description of the Related Art

Generally, an organic light emitting display device is a self-emission display device which has an organic light emitting diode that emits light to display an image.

Since the organic light emitting display device does not require a separate light source unlike a liquid crystal display, it is possible to relatively reduce a thickness and a weight of the organic light emitting display device. Further, since the organic light emitting display device has high-quality characteristics such as low power consumption, high luminance, and a high response speed, the organic light emitting display device has received attention as the next-generation display device for portable electronic apparatuses.

In general, the organic light emitting diode includes a hole injection electrode, an organic emission layer, and an electron injection electrode. In the organic light emitting diode, a hole supplied from the hole injection electrode and an electron supplied from the electron injection electrode are coupled with each other in the organic emission layer to form an exciton, and light is generated by energy generated when the exciton falls in a ground state.

The organic light emitting display device is divided into a top emission type organic light emitting display device and a bottom emission type organic light emitting display device according to a direction in which light generated from the organic emission layer is emitted.

In the case of the bottom emission type organic light emitting display device, since self-emission efficiency is not high, an optical cavity layer generating optical resonance may be included in order to improve emission efficiency.

The light generated from the emission layer is repeatedly reflected in the optical cavity layer to cause constructive interference or destructive interference. That is, light having a predetermined wavelength is amplified and light having other wavelengths is offset, and as a result, only the light having the predetermined wavelength selectively passes through the optical cavity layer. Accordingly, emission efficiency, luminance, and color purity of the organic light emitting display device including the optical cavity layer may be improved.

However, since an optical distance between the optical cavity layers is set as an optimal distance when the organic light emitting display device including the optical cavity layer is viewed from a front side, a change in an interference length of light occurs when viewed from a side. As a result, as a viewing angle is changed, a decrease in luminance and a color shift as compared with a front side are caused, and as a result, many display characteristics deteriorate.

SUMMARY

The present disclosure has been made in an effort to provide an organic light emitting display device in which a decrease in luminance and a color shift as compared with a front side are small even if a viewing angle is changed.

An example embodiment of the present disclosure provides an organic light emitting display device including a substrate, an insulating layer on the substrate, and a display element layer on the insulating layer, in which the insulating layer includes one or more low refractive layers and one or more high refractive layers.

A color filter layer may be between the substrate and the insulating layer.

The display element layer may include a first electrode on the insulating layer, an emission layer on the first electrode, and a second electrode on the emission layer.

The low refractive layers and the high refractive layers may be alternately formed.

A refractive index of the low refractive layer may be about 1.3 or more to less than 1.6.

A refractive index of the high refractive layer may be about 1.6 or more to 2.4 or less.

The low refractive layer may include at least one of $SiO_2$ and $MgF_3$.

The high refractive layer may include at least one of $Si_3N_4$, $TiO_2$, MgO, $Al_2O_3$, SiO and ZnS.

A thickness of the low refractive layer may be about 1,000 Å or more to 6,000 Å or less.

A thickness of the high refractive layer may be about 1,000 Å or more to 8,000 Å or less.

A thin film transistor (TFT) layer electrically connected to the first electrode may be between the substrate and the insulating layer.

A color filter layer may be between the thin film transistor (TFT) layer and the insulating layer.

Another example embodiment of the present disclosure provides an organic light emitting display device including a substrate, an insulating layer on the substrate, a first electrode on the insulating layer, an emission layer on the first electrode, and a second electrode on the emission layer, in which the insulating layer includes one or more low refractive layers and one or more high refractive layers.

The organic light emitting display device may further include a pixel defining layer on the insulating layer and the first electrode and dividing the first electrode into an emission area and a non-emission area.

A color filter layer may be between the substrate and the insulating layer.

According to the example embodiments of the present disclosure, it is possible to reduce a luminance change and a color shift as compared with a front side according to a change of a viewing angle by forming an insulating layer functioning as an optical cavity layer as a multi-layered structure.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION OF THE PREFERRED EMBODIMENT

Hereinafter, example embodiments of the present disclosure will be described in detail with reference to the accompanying drawing.

Although the present disclosure can be modified variously and have several embodiments, specific example embodiments are illustrated in the accompanying drawings and will be mainly described in the specification. However, the scope of the present disclosure is not limited to the specific embodiments and should be construed as including all the changes, equivalents, and substitutions included in the spirit and scope of the present disclosure.

In this specification, specific structural or functional descriptions are just exemplified to describe example embodiments, and the example embodiments of the present disclosure can be implemented in various forms, and the present disclosure is not limited to the example embodiments described in this specification. It should be understood that the present disclosure contains all changes, equivalents, and substitutions included in the spirit and the scope of the present disclosure.

It will be understood that when an element is simply referred to as being "connected to" or "contacted to" another element, it may be "directly connected to" or "directly contacted to" another element or intervening elements may also be present.

Further, it may be understood that when an element is referred to as being "directly connected to" or "directly contacted to" another element, there are no intervening elements present. Other expressions describing the relationships among the elements, for example, "between," "directly between" or "adjacent to" and "directly adjacent to" may also be analyzed similarly.

Terms used in the specification are just used to describe illustrative example embodiments and are not intended to limit the present disclosure. A singular expression includes plural expressions as long as the expressions do not have apparently different contextual meaning.

In this specification, terms such as "comprise", "include", or "have" are used to designate presence of implemented features, figures, steps, operations, elements, parts, or combinations thereof and it should be understood that presence or addition possibilities of one or more other features or figures, steps, operations, elements, parts, or combinations thereof are not excluded in advance. If not differently defined, all terms used herein, which include technical or scientific terms, have the same meanings as those generally appreciated by those skilled in the art. It should be understood that terms defined in a generally used dictionary have the same meanings as contextual meanings of associated techniques and if not apparently defined in this application, the terms are not ideally or excessively understood as formal meanings.

Terms used in the specification, "first," "second," "third," etc., can be used to describe various elements, but the elements are not construed as being limited to the terms. The terms are only used to differentiate one element from other elements. For example, the 'first' element may be named the "second" or "third" element without departing from the scope of the present disclosure and similarly, the "second" or "third" element may also be alternately named.

Parts which are not associated with the description are omitted in order to specifically describe the present disclosure and like reference numerals refer to like elements throughout the specification. Further, in the drawings, size and thickness of each element are arbitrarily illustrated for convenience of description, and the present disclosure is not necessarily limited by those illustrated in the drawings.

In the drawings, the thicknesses of layers and areas are enlarged for clarity. In the drawings, the thicknesses of some layers and areas are exaggerated for convenience of description.

Figure 1:
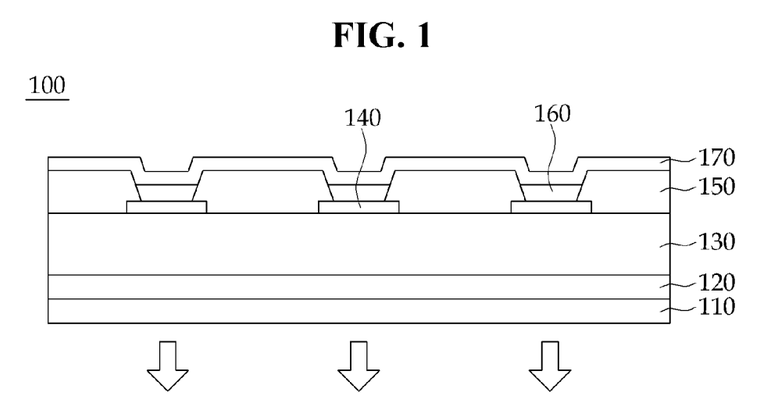
FIG. 1 is a diagram illustrating an organic light emitting display device with an insulating layer formed as a single-layered structure in the related art.

FIG. 1 is a diagram illustrating an organic light emitting display device with an insulating layer formed as a single-layered structure in the related art. The organic light emitting display device 100 with an insulating layer formed as a single-layered structure in the related art may include a substrate 110, a thin film transistor layer 120 on the substrate, an insulating layer 130 on the thin film transistor layer, a first electrode 140 on the insulating layer, a pixel defining layer 150 dividing the first electrode into an emission area and a non-emission area, an emission layer 160 on the emission area of the first electrode divided by the pixel defining layer, and a second electrode 170 on the emission layer.

The organic light emitting display device 100 with an insulating layer formed as a single-layered structure is a bottom emission type organic light emitting display device.

Although not illustrated in FIG. 1, a color filter layer corresponding to the emission layer 160 may be between the thin film transistor layer 120 and the insulating layer 130.

Figure 2A:
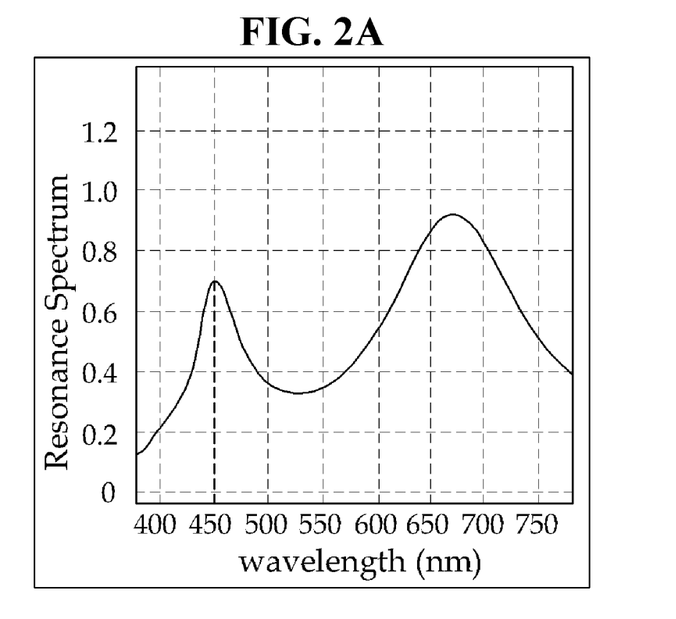
FIGS. 2A and 2B are a diagram illustrating a resonance spectrum of the organic light emitting display device with an insulating layer formed as a single-layered structure in the related art.
Figure 2B:
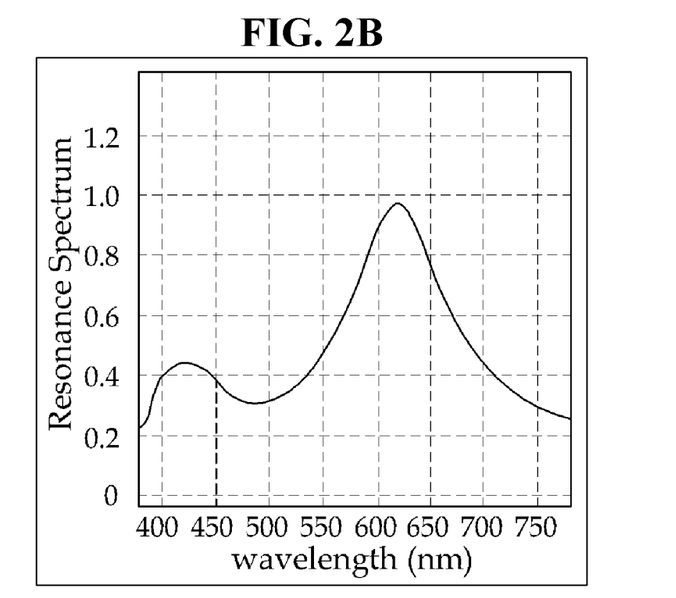

FIGS. 2A and 2B are a diagram illustrating a resonance spectrum according to a viewing angle of the organic light emitting display device with an insulating layer formed as a single-layered structure in the related art.

Hereinafter, the viewing angle means an angle at which a user views the organic light emitting display device. That is, if a viewing angle when the user views the organic light emitting display device from the front side is 0 degree, an angle between a vertical line to the organic light emitting display device and user's eyes when the user views the organic light emitting display device from the side is called a viewing angle. Accordingly, viewing angles of 0 degree to 90 degrees at the left and the right based on the front side may exist, respectively.

FIG. 2A is a diagram illustrating a resonance spectrum of the organic light emitting display device 100 with an insulating layer 130 formed as a single-layered structure in the related art when the viewing angle is 0 degree, and FIG. 2B is a diagram illustrating a resonance spectrum of the organic light emitting display device 100 with an insulating layer 130 formed as a single-layered structure in the related art when the viewing angle is 50 degrees.

When comparing FIG. 2A and FIG. 2B based on a blue wavelength of 420 to 470 nm, FIG. 2A has a peak value when the blue wavelength is 450 nm, and FIG. 2B has a peak value when the blue wavelength is 425 nm.

As such, when the viewing angle is changed from 0 degree to 90 degrees, a change amount of peak value of the resonance spectrum is increased. As the change amount of peak value of the resonance spectrum is increased, a color shift amount is increased.

That is, when the viewing angle is changed from 0 degree to 90 degrees, a color shift and an entire display characteristic deterioration may be occur.

In order to prevent the color shift according to the viewing angle, the present disclosure provides an organic light emitting display device with an insulating layer formed as a multi-layered structure and functioning as an optical cavity layer.

Figure 3:
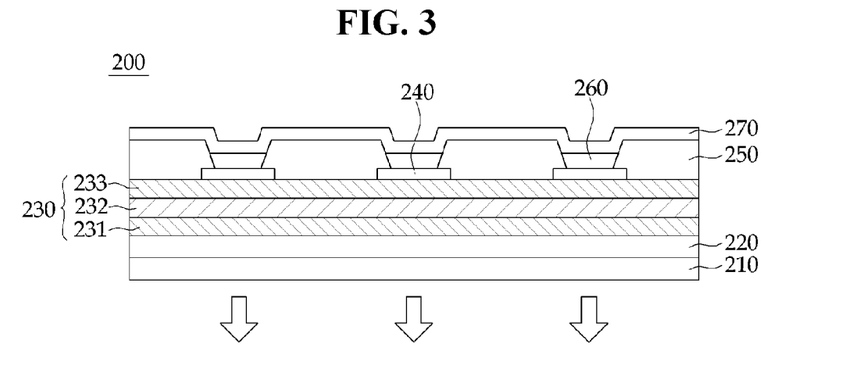
FIG. 3 is a diagram illustrating an organic light emitting display device with an insulating layer formed as a multi-layered structure according to an example embodiment of the present disclosure.

FIG. 3 is a diagram illustrating an organic light emitting display device with an insulating layer formed as a multi-layered structure according to an example embodiment of the present disclosure.

An organic light emitting display device 200 with an insulating layer formed as a multi-layered structure according to an example embodiment of the present disclosure may include a substrate 210, a thin film transistor layer 220 on the substrate, an insulating layer 230 on the thin film transistor layer and functioning as an optical cavity layer, a first electrode 240 on the insulating layer, a pixel defining layer 250 dividing the first electrode into an emission area and a non-emission area, an emission layer 260 on the emission area of the first electrode divided by the pixel defining layer, and a second electrode 270 on the emission layer.

The insulating layer 230 may include a first high refractive layer 231, a first low refractive layer 232, and a second high refractive layer 233.

Although not illustrated in FIG. 3, a color filter layer may be between the thin film transistor layer 220 and the insulating layer 230.

The organic light emitting display device 200 with an insulating layer formed as a multi-layered structure according to the example embodiment of the present disclosure is a bottom emission type organic light emitting display device.

First, as the substrate 210, a transparent insulation substrate may be used. For example, the substrate 210 may be configured by a glass substrate, a quartz substrate, a transparent resin substrate, or the like. The transparent resin substrate which is usable as the substrate 210 may contain a polyimide resin, an acrylic resin, a polyacrylate resin, a polycarbonate resin, a polyether resin, a polyethylene terephthalate resin, a sulfonic acid resin, and the like. These materials may be used either alone or in combination thereof. The substrate 210 may be properly selected and used according to the need of those skilled in the art.

The thin film transistor layer 220 electrically connected with the first electrode 240 may be on the substrate 210. Although not illustrated in FIG. 3, a semiconductor device including a gate electrode, a source electrode, and a drain electrode may be formed as the thin film transistor layer 220. The drain electrode may be electrically connected with the first electrode 240. The semiconductor device may be formed by a general method of forming a thin film transistor. Accordingly, the description for a detailed method of forming the semiconductor device or the thin film transistor is omitted.

Although not illustrated in FIG. 3, a buffer layer made of silicon oxide or silicon nitride may be included between the substrate 210 and the thin film transistor layer 220.

The insulating layer 230 may be on the thin film transistor layer 220. The insulating layer 230 has a thickness enough to cover semiconductor devices configuring the thin film transistor layer 220 formed on the substrate 210.

In the case where the organic light emitting display device 200 is a bottom emission type organic light emitting display device, since the insulating layer 230 is on a light path where the light generated from the emission layer 260 is emitted, the insulating layer 230 serves as the optical cavity layer.

The insulating layer 230 may be formed as a single-layered structure, but may be formed as a multi-layered structure having at least two or more layers. When the insulating layer 230 is formed as the multi-layered structure, the insulating layer 230 may include one or more low refractive layers and one or more high refractive layers.

The low refractive layer may be made of a material having a refractive index of 1.3 or more to less than 1.6, and the high refractive layer may be made of a material having a refractive index of 1.6 or more to less than 2.4.

The low refractive layer may include at least one of $SiO_2$ (n=1.4 to 1.5) and $MgF_3$ (n=1.3 to 1.4), and the high refractive layer may include at least one selected from the group of $Si_3N_4$ (n=1.8 to 1.9), $TiO_2$ (n=2.0 to 2.3), MgO (n=1.74), $Al_2O_3$ (n=1.8 to 1.9), SiO (n=1.8 to 1.9), and ZnS (n=2.3 to 2.4).

The low refractive layers and the high refractive layers may be alternately formed. In FIG. 3, the first high refractive layer 231, the first low refractive layer 232, and the second high refractive layer 233 are sequentially laminated, but if necessary, the low refractive layers and the high refractive layers may be additionally laminated.

The first high refractive layer 231 may have a thickness of about 1,000 Å or more to 6,000 Å or less, the first low refractive layer 232 may have a thickness of about 1,000 Å or more to about 5,000 Å or less, and the second high refractive layer 233 may have a thickness of about 1,000 Å or more to about 6,000 Å or less.

The respective low refractive layers and high refractive layers configuring the insulating layer 230 may be formed by using a spin coating process, a printing process, a sputtering process, a chemical vapor deposition (CVD) process, an atomic layer deposition (ALD) process, a plasma enhanced chemical vapor deposition (PECVD) process, a high density plasma-chemical vapor deposition (HDP-CVD) process, a vacuum deposition process, and the like, according to a constituent material.

Although not illustrated in FIG. 3, a color filter may be between the thin film transistor layer 220 and the insulating layer 230. The color filter may include a color filter transmitting a wavelength of a red area, a color filter transmitting a wavelength of a green area, and a color filter transmitting a wavelength of a blue area. The kind of color filter may be determined to correspond to a light emitting color of a light emitting material configuring the emission layer 260.

The first electrode 240 may be formed on the insulating layer 230. Since the organic light emitting display device 200 is a bottom emission type organic light emitting display device, the first electrode 240 may be formed as a transparent electrode. Transparent conductive oxide (TCO) constituting the first electrode 240 may include at least one selected from the group of indium tin oxide, indium zinc oxide, zinc tin oxide, zinc oxide, tin oxide, and gallium oxide. These materials may be used either alone or in combination thereof.

The pixel defining layer 250 may be between the first electrodes 240. The pixel defining layer 250 may be made of a material having an insulation property and overlapped with an end of the first electrode 240 to divide the first electrodes 240 by a pixel unit and define a pixel area. The pixel defining layer 250 may be on the first electrode 240 to divide an emission area and a non-emission area of the first electrode 240.

The emission layer 260 may be on the emission area of the first electrode 240 divided by the pixel defining layer 250.

The emission layer 260 may be formed by using light emitting materials capable of generating different color light such as red light, green light, and blue light. According to another example embodiment, the emission layer 260 may have a multi-layered structure which emits white light by laminating a plurality of light emitting materials capable of implementing different color light such as red light, green light, and blue light. According to another example embodiment, the emission layer 260 may be extended up to the upper part of the emission area of the first electrode 240 and the upper part of the pixel defining layer 250 area.

The second electrode 270 may be formed on the emission layer 260. Since the organic light emitting display device 200 is a bottom emission type organic light emitting display device, the second electrode 270 may be formed as a reflective electrode. The second electrode 270 may include at least one selected from the group of aluminum (Al), platinum (Pt), gold (Au), chromium (Cr), tungsten (T), molybdenum (Mo), titanium (Ti), palladium (Pd), and iridium (Ir), and an alloy thereof. These materials may be used either alone or in combination thereof.

The second electrode 270 may be formed only on the emission layer 260, and may be formed to be extended onto the pixel defining layer 250 and the emission layer 260.

Although not illustrated in FIG. 3, a hole injection layer (HIL) and a hole transport layer (HTL) may be between the first electrode 240 and the emission layer 260, and an electron transport layer (ETL) and an electron injection layer (EIL) may be between the emission layer 260 and the second electrode 270.

Figure 4:
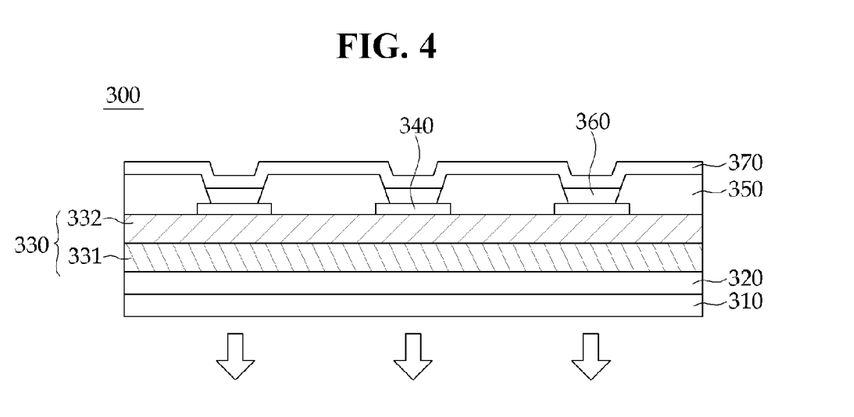
FIG. 4 is a diagram illustrating an organic light emitting display device with an insulating layer formed as a multi-layered structure according to another example embodiment of the present disclosure.

FIG. 4 is a diagram illustrating an organic light emitting display device with an insulating layer formed as a multi-layered structure according to another example embodiment of the present disclosure.

In an organic light emitting display device 300 illustrated in FIG. 4, the description for duplicated parts with the organic light emitting display device 200 illustrated in FIG. 3 will be omitted.

An organic light emitting display device 300 with an insulating layer formed as a multi-layered structure according to an example embodiment of the present disclosure may include a substrate 310, a thin film transistor layer 320 on the substrate, an insulating layer 330 on the thin film transistor layer and functioning as an optical cavity layer, a first electrode 340 on the insulating layer, a pixel defining layer 350 dividing the first electrode into an emission area and a non-emission area, an emission layer 360 on the emission area of the first electrode divided by the pixel defining layer, and a second electrode 370 on the emission layer.

The insulating layer 330 may include a high refractive layer 331 and a low refractive layer 332.

Although not illustrated in FIG. 4, a color filter layer may be between the thin film transistor layer 320 and the insulating layer 330.

The low refractive layer 332 may be made of a material having a refractive index n of 1.3 or more to less than 1.6, and the high refractive layer 331 may be made of a material having a refractive index n of 1.6 or more to 2.4 or less.

The low refractive layer 332 may include at least one of $SiO_2$ (n=1.4 to 1.5) and $MgF_3$ (n=1.3 to 1.4), and the high refractive layer 331 may include at least one selected the group of $Si_3N_4$ (n=1.8 to 1.9), $TiO_2$ (n=2.0 to 2.3), MgO (n=1.74), $Al_2O_3$ (n=1.8 to 1.9), SiO (n=1.8 to 1.9), and ZnS (n=2.3 to 2.4).

The high refractive layer 331 may have a thickness of 3,000 Å or more to 8,000 Å or less, and the low refractive layer 332 may have a thickness of 1,000 Å or more to 6,000 Å or less.

Hereinafter, preferable embodiment of the present disclosure will be described. However, the following embodiment is just exemplified in order to better understand the present disclosure, and the present disclosure is not limited to the following embodiment.

EMBODIMENT

After a thin film transistor layer is formed on a transparent substrate, an insulating layer is formed on the thin film transistor layer, and an organic light emitting diode is formed on the planarized insulating layer. The insulating layer may include a first high refractive layer, a first low refractive layer, and a second high refractive layer. The first high refractive layer is formed at a thickness of 3,400 Å by using $Si_3N_4$, the first low refractive layer is formed at a thickness of 1,750 Å by using $SiO_2$, and the second high refractive layer is formed at a thickness of 1, 250 Å by using $Si_3N_4$.

REFERENCE

After a thin film transistor layer is formed on a transparent substrate, an insulating layer is formed on the thin film transistor layer, and an organic light emitting diode is formed on the planarized insulating layer. The insulating layer is formed at a thickness of 1,400 Å by using $SiO_2$.

Figure 5A:
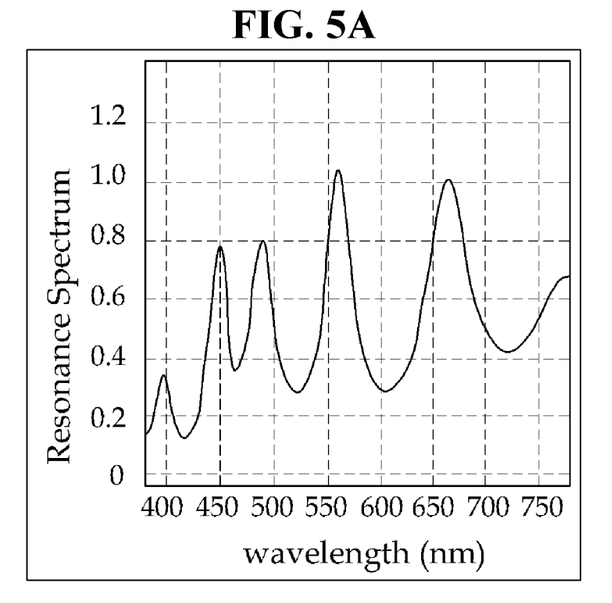
FIGS. 5A and 5B are a diagram illustrating a resonance spectrum of an organic light emitting display device with an insulating layer formed as a multi-layered structure according to an example embodiment of the present disclosure.
Figure 5B:
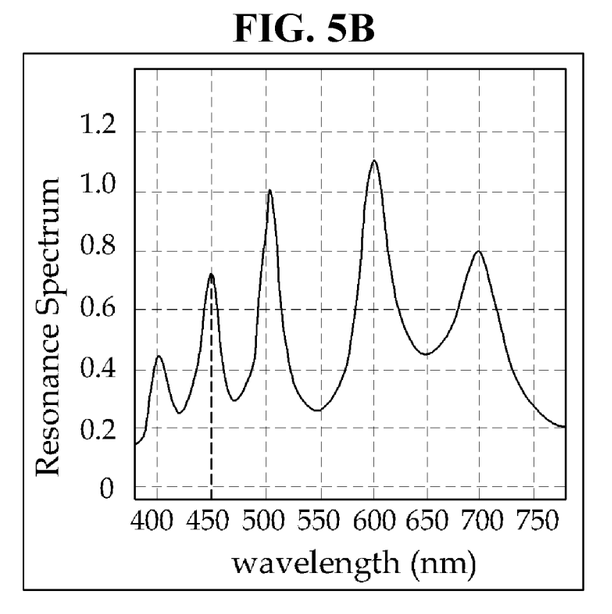

FIGS. 5A and 5B are a diagram illustrating a resonance spectrum of an organic light emitting display device (Embodiment) with an insulating layer formed as a multi-layered structure according to the Embodiment.

FIG. 5A is a diagram illustrating a resonance spectrum of the organic light emitting display device with an insulating layer formed as a multi-layered structure according to the Embodiment when a viewing angle is 0 degree, and FIG. 5B is a diagram illustrating a resonance spectrum of the organic light emitting display device with an insulating layer formed as a multi-layered structure according to the Embodiment when the viewing angle is 50 degrees.

In the organic light emitting display device with an insulating layer formed as a multi-layered structure according to the Embodiment, since the insulating layer functioning as an optical cavity layer is formed as a multi-layered structure, the resonance spectrum is illustrated as a multi-peak resonance spectrum having a plurality of peak values.

Since the resonance spectrum has a plurality of peak values, although the viewing angle is changed, the peak value of the resonance spectrum may be controlled to be positioned within a desired wavelength range by controlling thicknesses of layers constituting the insulating layer.

When comparing FIG. 5A and FIG. 5B based on a blue wavelength of 420 to 470 nm, it can be seen that FIG. 5A has a peak value when the wavelength is 450 nm, and FIG. 5B also has a peak value when the wavelength is 450 nm. As such, although the viewing angle is changed from 0 degree to 50 degree, the peak values are generated at the same wavelength, and as a result, although the viewing angle is changed, the color shift amount is small.

Further, since the organic light emitting display device according to the example embodiment of the present disclosure includes a color filter layer corresponding to the emission layer on a path of emitted light, influence due to a resonance spectrum generated outside of a desired wavelength range may be excluded.

Figure 6A:
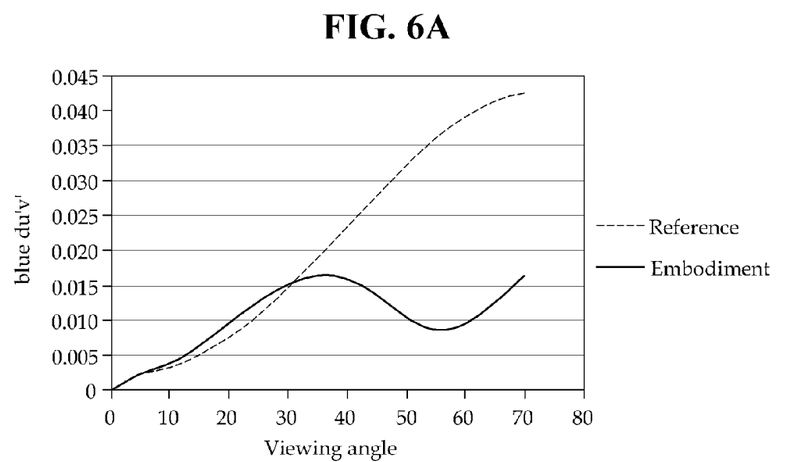
FIGS. 6A to 6C are a diagram illustrating a color shift according to a viewing angle of an organic light emitting display device with an insulating layer formed as a multi-layered structure according to an example embodiment of the present disclosure.
Figure 6B:
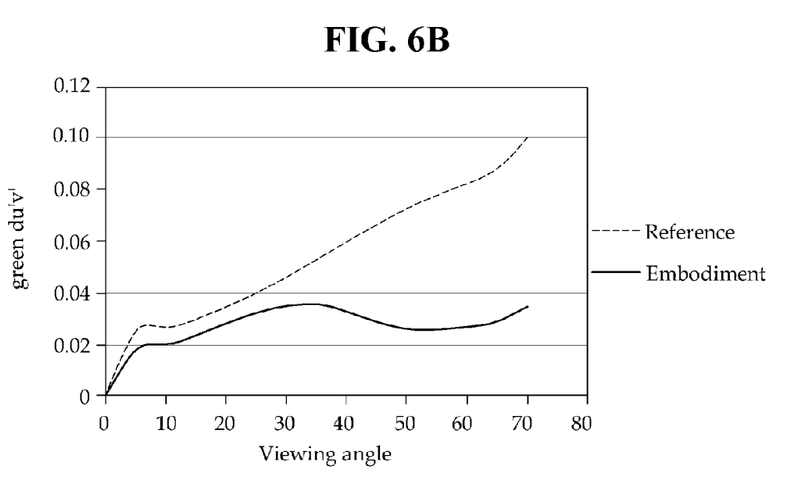
Figure 6C:
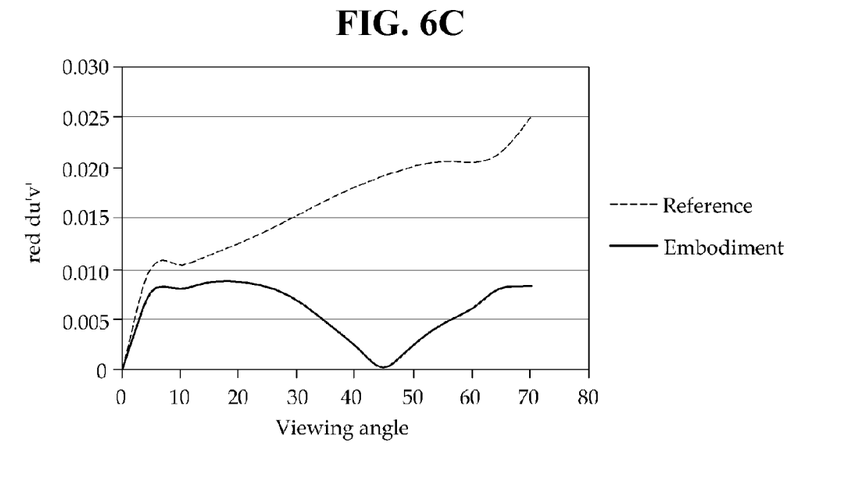

FIG. 6 is a diagram comparing color shift amounts according to a viewing angle of an organic light emitting display device (Embodiment) with an insulating layer formed as a multi-layered structure according to the Embodiment and an organic light emitting display device (Reference) with an insulating layer formed as a single-layered structure.

In more detail, FIG. 6A is a diagram illustrating a blue color shift amount du'v' of a side as compared with a front side according to a change of a viewing angle, FIG. 6B is a diagram illustrating a green color shift amount du'v' of a side as compared with a front side according to a change of a viewing angle, and FIG. 6C is a diagram illustrating a red color shift amount du'v' of a side as compared with a front side according to a change of a viewing angle.

Each of the color shift amounts du'v' means a difference between a color coordinate u'v' value when the organic light emitting display device is viewed from the front side and a color coordinate u'v' value when the organic light emitting display device is viewed while the viewing angle is changed from 0 degree to 90 degrees.

The color coordinate u'v' means the 1976 UCS diagram coordinate defined by Commission International de L'eclairage CIE 15.2.

The respective color shift amounts du'v' may be obtained by measuring color coordinate values of blue, green, and red of light which are emitted from the organic light emitting display devices of the Embodiment and the Reference. Further, the color coordinate values may be measured by using the organic light emitting display devices in which the emission layers are formed only by blue, green, and red.

Referring to FIGS. 6A to 6C, the color shift amount du'v' of the Embodiment according to a change of the viewing angle is significantly reduced as compared with the color shift amount du'v' of the Reference according to a change of the viewing angle.

That is, like the Embodiment, in the organic light emitting display device with an insulating layer formed as a multi-layered structure, the color shift according to a viewing angle is reduced and the entire display characteristics are improved.

The organic light emitting display device with the insulating layer formed as the multi-layered structure described above is only exemplified, and those skilled in the art can understand that the scope of the present disclosure may include various modifications and equivalent embodiments therefrom.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An organic light emitting display device, comprising:
   a substrate;
   an insulating layer on the substrate; and
   a display element layer on the insulating layer,
   wherein the insulating layer includes one or more low refractive layers and one or more high refractive layers.

2. The organic light emitting display device of claim 1, wherein a color filter layer is between the substrate and the insulating layer.

3. The organic light emitting display device of claim 1, wherein the display element layer includes
   a first electrode on the insulating layer;
   an emission layer on the first electrode; and
   a second electrode on the emission layer.

4. The organic light emitting display device of claim 1, wherein the low refractive layers and the high refractive layers are alternately formed.

5. The organic light emitting display device of claim 1, wherein the refractive index of the low refractive layer is about 1.3 or more to less than about 1.6.

6. The organic light emitting display device of claim 1, wherein the refractive index of the high refractive layer is about 1.6 or more to about 2.4 or less.

7. The organic light emitting display device of claim 1, wherein the low refractive layer includes at least one of $SiO_2$ and $MgF_3$.

8. The organic light emitting display device of claim 1, wherein the high refractive layer includes at least one of $Si_3N_4$, $TiO_2$, $MgO$, $Al_2O_3$, $SiO$ and $ZnS$.

9. The organic light emitting display device of claim 1, wherein the thickness of the low refractive layer is about 1,000 Å or more to about 6,000 Å or less.

10. The organic light emitting display device of claim 1, wherein the thickness of the high refractive layer is about 1,000 Å or more to about 8,000 Å or less.

11. The organic light emitting display device of claim 1, wherein a thin film transistor (TFT) layer electrically connected to the first electrode is between the substrate and the insulating layer.

12. The organic light emitting display device of claim 11, wherein a color filter layer is between the thin film transistor (TFT) layer and the insulating layer.

13. An organic light emitting display device, comprising:
    a substrate;
    an insulating layer on the substrate;
    a first electrode on the insulating layer;
    an emission layer on the first electrode; and
    a second electrode on the emission layer,
    wherein the insulating layer includes one or more low refractive layers and one or more high refractive layers.

14. The organic light emitting display device of claim 13, further comprising:
    a pixel defining layer on the insulating layer and the first electrode and configured to divide the first electrode into an emission area and a non-emission area.

15. The organic light emitting display device of claim 13, wherein a color filter layer is between the substrate and the insulating layer.

16. The organic light emitting display device of claim 14, wherein the low refractive layers and the high refractive layers are alternately formed.

17. The organic light emitting display device of claim 14, wherein the refractive index of the low refractive layer is about 1.3 or more to less than about 1.6.

18. The organic light emitting display device of claim 14, wherein the refractive index of the high refractive layer is about 1.6 or more to about 2.4 or less.

19. The organic light emitting display device of claim 14, wherein the low refractive layer includes at least one of $SiO_2$ and $MgF_3$.

20. The organic light emitting display device of claim 14, wherein the high refractive layer includes at least one of $Si_3N_4$, $TiO_2$, MgO, $Al_2O_3$, SiO and ZnS.

* * * * *